(12) United States Patent
Suzuki et al.

(10) Patent No.: US 10,933,618 B2
(45) Date of Patent: Mar. 2, 2021

(54) CARRIER PLATE REMOVING METHOD

(71) Applicant: DISCO CORPORATION, Tokyo (JP)

(72) Inventors: Katsuhiko Suzuki, Tokyo (JP);
Takatoshi Sakurai, Tokyo (JP);
Hayato Kiuchi, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 16/748,226

(22) Filed: Jan. 21, 2020

(65) Prior Publication Data

US 2020/0230936 A1    Jul. 23, 2020

(30) Foreign Application Priority Data

Jan. 22, 2019   (JP) .............................. JP2019-008376

(51) Int. Cl.
*B32B 43/00*    (2006.01)
*H01L 21/56*    (2006.01)
*B32B 38/10*    (2006.01)

(52) U.S. Cl.
CPC ............ *B32B 43/006* (2013.01); *B32B 38/10* (2013.01); *H01L 21/568* (2013.01); *Y10T 156/1111* (2015.01); *Y10T 156/1121* (2015.01); *Y10T 156/1126* (2015.01); *Y10T 156/1168* (2015.01); *Y10T 156/1184* (2015.01); *Y10T 156/1922* (2015.01); *Y10T 156/1928* (2015.01); *Y10T 156/1933* (2015.01)

(58) Field of Classification Search
CPC .. B32B 38/10; B32B 43/006; Y10T 156/1111; Y10T 156/1121; Y10T 156/1126; Y10T 156/1168; Y10T 156/1184; Y10T 156/1922; Y10T 156/1928; Y10T 156/1933

See application file for complete search history.

(56) References Cited

U.S. PATENT DOCUMENTS

| 3,988,196 | A | * | 10/1976 | Wanesky | B23Q 3/086 156/541 |
|---|---|---|---|---|---|
| 5,091,331 | A | * | 2/1992 | Delgado | H01L 21/2007 148/DIG. 28 |
| 5,447,596 | A | * | 9/1995 | Hayase | H01L 21/6835 156/701 |
| 5,800,665 | A | * | 9/1998 | Okaniwa | B32B 43/00 134/104.3 |

(Continued)

FOREIGN PATENT DOCUMENTS

JP    2016201519 A    12/2016

*Primary Examiner* — Mark A Osele
*Assistant Examiner* — Nickolas R Harm
(74) *Attorney, Agent, or Firm* — Greer, Burns & Crain, Ltd.

(57) ABSTRACT

A carrier plate removing method for removing a carrier plate from a workpiece previously provided through a temporary bonding layer on the front side of the carrier plate is provided. The carrier plate removing method includes a shoulder portion forming step of processing a peripheral portion of the carrier plate along a peripheral edge thereof from the front side of the carrier plate on which the workpiece is provided, thereby forming a shoulder portion as a lower part connected to the back side of the carrier plate, the lower part projecting horizontally outward from the side surface of an upper part connected to the front side of the carrier plate.

17 Claims, 4 Drawing Sheets

(56) References Cited

U.S. PATENT DOCUMENTS

| | | | |
|---|---|---|---|
| 6,066,229 A * | 5/2000 | Komine | A61K 31/4415 |
| | | | 134/1 |
| 8,080,123 B2 * | 12/2011 | Nakamura | B29C 63/0013 |
| | | | 156/247 |
| 8,409,973 B2 * | 4/2013 | Chida | H01L 21/67092 |
| | | | 438/478 |
| 9,472,437 B2 * | 10/2016 | George | H01L 21/67282 |
| 9,919,509 B2 * | 3/2018 | Hirakawa | H01L 21/67051 |
| 10,259,207 B2 * | 4/2019 | Ohno | B32B 43/006 |
| 2005/0173064 A1 * | 8/2005 | Miyanari | H01L 21/6708 |
| | | | 156/703 |
| 2007/0125751 A1 * | 6/2007 | Nakamura | H01L 21/67092 |
| | | | 216/83 |
| 2009/0218050 A1 * | 9/2009 | Nakamura | H01L 21/67017 |
| | | | 156/754 |
| 2009/0277591 A1 * | 11/2009 | Zhao | G11B 5/102 |
| | | | 156/703 |
| 2011/0048611 A1 * | 3/2011 | Carre | H01L 21/6835 |
| | | | 156/73.1 |
| 2011/0253315 A1 * | 10/2011 | George | H01L 21/67132 |
| | | | 156/718 |
| 2011/0308739 A1 * | 12/2011 | McCutcheon | H01L 21/187 |
| | | | 156/766 |
| 2012/0000613 A1 * | 1/2012 | Thallner | H01L 21/67092 |
| | | | 156/703 |
| 2012/0152465 A1 * | 6/2012 | Lindner | B32B 38/10 |
| | | | 156/701 |
| 2013/0025796 A1 * | 1/2013 | Burggraf | H01L 21/67092 |
| | | | 156/703 |
| 2013/0032297 A1 * | 2/2013 | Coto | B32B 43/006 |
| | | | 156/705 |
| 2013/0133838 A1 * | 5/2013 | Kim | B32B 37/00 |
| | | | 156/707 |
| 2015/0328872 A1 * | 11/2015 | Koyanagi | B23K 26/0853 |
| | | | 156/73.1 |
| 2019/0160804 A1 * | 5/2019 | Hinohara | B23K 26/0622 |

* cited by examiner

CARRIER PLATE REMOVING METHOD

BACKGROUND OF THE INVENTION

Field of the Invention

The present invention relates to a carrier plate removing method for removing a carrier plate from a workpiece previously provided through a temporary bonding layer on the front side of the carrier plate.

Description of the Related Art

In electronic equipment typified by a mobile phone and a personal computer, a device chip including a device such as an electronic circuit is an essential component. For example, the device chip is obtained by setting a plurality of division lines (streets) on a front side of a wafer formed of a semiconductor such as silicon to thereby partition the front side of the wafer into a plurality of separate regions, next forming a device in each separate region, and next dividing the wafer along each division line.

The device chip obtained by the above method is fixed to a mother substrate for chip size package (CSP), and then electrically connected to terminals or the like on the mother substrate by any bonding method such as wire bonding. Thereafter, the device chip on the mother substrate is sealed with a mold resin. In this manner, the device chip is sealed with the mold resin to form a package device, so that the device chip can be protected from any external factors such as shock, light, heat, and water.

In recent years, a packaging technique called a fan-out wafer level packaging (FOWLP) has started being adopted, in which package terminals are formed outside the area of the device chip by using a wafer level redistribution technique (see Japanese Patent Laid-Open 2016-201519, for example). Further, another packaging technique called a fan-out panel level packaging (FOPLP) has also been proposed, in which package devices are collectively manufactured with the level of a panel larger in size than a wafer (typically, with the level of a glass substrate for use in the manufacture of a liquid crystal panel).

In FOPLP, a redistribution layer (RDL) is formed through a temporary bonding layer on the front side of a carrier plate as a temporary substrate, and device chips are then bonded to this redistribution layer. Thereafter, these device chips are sealed with a mold resin to obtain a package panel. Thereafter, the package panel is thinned by any method such as grinding, and next divided into package devices.

SUMMARY OF THE INVENTION

In the FOPLP mentioned above, the package panel is divided into the package devices, and the carrier plate is next removed from the package devices. More specifically, each package device is picked up from the carrier plate. However, when each package device is small in size, it is difficult to pick up each package device from the carrier plate.

As another method, the carrier plate may be peeled from the package panel before dividing the package panel into the package devices. However, since the temporary bonding layer has strong adhesion to some extent, it is difficult to peel the carrier plate from the package panel without causing damage to the package panel and the carrier plate.

It is therefore an object of the present invention to provide a carrier plate removing method which can easily remove the carrier plate from a workpiece such as a package panel.

In accordance with an aspect of the present invention, there is provided a carrier plate removing method for removing a carrier plate from a workpiece, the carrier plate having a front side and a back side opposite to the front side, the workpiece being previously provided through a temporary bonding layer on the front side of the carrier plate, the carrier plate removing method including a shoulder portion forming step of processing a peripheral portion of the carrier plate along a peripheral edge thereof from the front side of the carrier plate on which the workpiece is provided, thereby forming a shoulder portion as a lower part connected to the back side of the carrier plate, the lower part projecting horizontally outward from the side surface of an upper part connected to the front side of the carrier plate; a holding step of holding the workpiece by using a holding unit from the upper side of the workpiece in the condition where the workpiece is positioned above the carrier plate, after performing the shoulder portion forming step; and a carrier plate removing step of applying a downward force from a push member to the shoulder portion after performing the holding step, thereby moving the carrier plate away from the workpiece to thereby remove the carrier plate from the workpiece.

Preferably, the carrier plate removing step includes the step of spraying a fluid to the boundary between the carrier plate and the workpiece, the downward force being applied from the push member to the shoulder portion after spraying the fluid or as spraying the fluid, thereby removing the carrier plate from the workpiece.

Preferably, the carrier plate removing step includes the step of immersing the workpiece and the carrier plate in a liquid, the downward force being applied from the push member to the shoulder portion in the condition where the workpiece and the carrier plate are immersed in the liquid. More preferably, the liquid contains a surface active agent.

Preferably, the carrier plate removing step includes the step of applying vibration to the push member in the condition where the workpiece and the carrier plate are immersed in the liquid, the downward force being applied from the push member to the shoulder portion as applying the vibration to the push member.

Preferably, the carrier plate removing step includes the step of applying vibration to the liquid in the condition where the workpiece and the carrier plate are immersed in the liquid, the downward force being applied from the push member to the shoulder portion as applying the vibration to the liquid.

As described above, the carrier plate removing method of the present invention includes the shoulder portion forming step of processing the peripheral portion of the carrier plate along the peripheral edge thereof from the front side of the carrier plate on which the workpiece is provided, thereby forming the shoulder portion as a lower part connected to the back side of the carrier plate, the lower part projecting horizontally outward from the side surface of an upper part connected to the front side of the carrier plate. Accordingly, by applying a downward force to the shoulder portion in the condition where the workpiece is held by the holding unit from the upper side of the workpiece, the carrier plate can be easily removed from the workpiece. Further, since gravity acts on the carrier plate in addition to the downward force applied to the shoulder portion, the carrier plate can be removed from the workpiece even when the downward force to be applied to the shoulder portion is small.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described with reference to the attached drawings. The carrier plate removing method according to this preferred embodiment is used in removing a carrier plate from a workpiece previously provided through a temporary bonding layer on the front side of the carrier plate. The carrier plate removing method includes a shoulder portion forming step (see FIGS. 1B, 2A, and 2B), a holding step (see FIG. 3A), and a carrier plate removing step (see FIGS. 3B and 3C).

In the shoulder portion forming step, a cutting blade is used to cut a peripheral portion of the carrier plate along a peripheral edge thereof from the front side of the carrier plate on which the workpiece is provided, thereby forming a shoulder portion on the carrier plate. In the holding step, the workpiece is held from the upper side thereof in the condition where the workpiece is positioned above the carrier plate. In the carrier plate removing step, a push member is used to apply a downward force to the shoulder portion of the carrier plate and thereby move the carrier plate away from the workpiece, thereby removing the carrier plate from the workpiece. The carrier plate removing method according to this preferred embodiment will now be described in more detail.

Figure 1A:
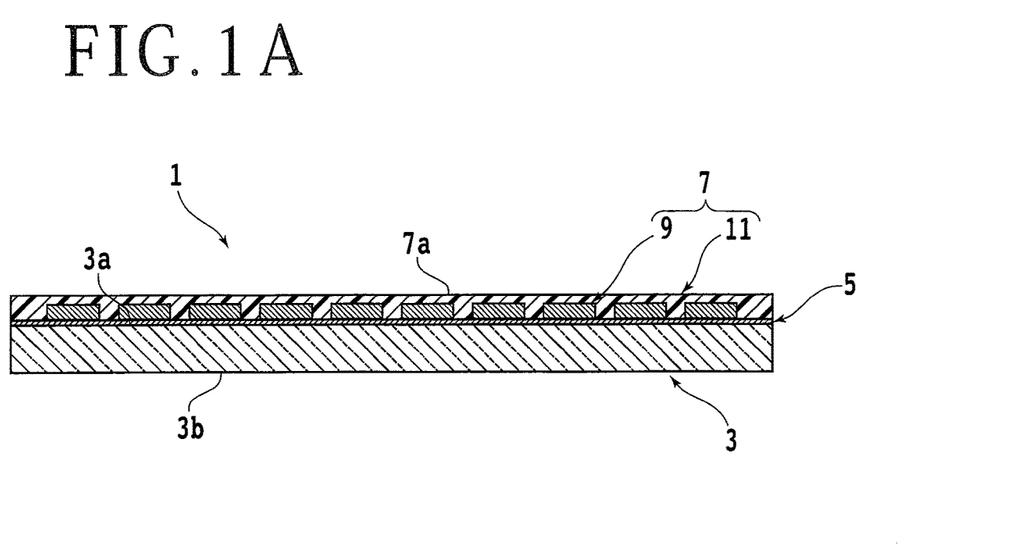
FIG. 1A is a sectional view depicting a configuration of a composite substrate including a carrier plate and a workpiece.

FIG. 1A is a sectional view depicting a configuration of a composite substrate 1 to be used in the carrier plate removing method according to this preferred embodiment. The composite substrate 1 includes a carrier plate 3 formed of an insulating material such as soda-lime glass, borosilicate glass, and silica glass. The carrier plate 3 has a substantially flat first surface (front side) 3a and a second surface (back side) 3b opposite to the first surface 3a. The carrier plate 3 is rectangular as viewed in plan, that is, as viewed from the first surface 3a or the second surface 3b. For example, the carrier plate 3 has a thickness of 2 mm or less, typically, 1.1 mm.

While the carrier plate 3 is formed of an insulating material such as soda-lime glass, borosilicate glass, and silica glass in this preferred embodiment, the material of the carrier plate 3 is not especially limited. Further, the shape, structure, size, etc. of the carrier plate 3 are also not especially limited. For example, a plate formed of a semiconductor, ceramics, resin, or metal may be used as the carrier plate 3. Further, a disk-shaped semiconductor wafer or the like may also be used as the carrier plate 3.

A workpiece 7 is provided on the first surface 3a of the carrier plate 3 with a temporary bonding layer 5 interposed therebetween. The temporary bonding layer 5 is formed by stacking metal films or insulating films, for example, on the whole of the first surface 3a of the carrier plate 3. The temporary bonding layer 5 has a function of bonding the carrier plate 3 and the workpiece 7. The temporary bonding layer 5 may be formed from a resin film functioning as an adhesive.

For example, the temporary bonding layer 5 has a thickness of 20 μm or less, typically, 5 μm. In peeling the carrier plate 3 from the workpiece 7 to thereby remove the carrier plate 3 from the workpiece 7 in the carrier plate removing step to be hereinafter described, the temporary bonding layer 5 is separated into a first part 5a (see FIG. 3C) adhering to the carrier plate 3 and a second part 5b (see FIG. 3C) adhering to the workpiece 7.

The workpiece 7 is called also a package panel or package wafer, for example. The workpiece 7 includes a redistribution layer (RDL) (not depicted) formed so as to come into contact with the temporary bonding layer 5, a plurality of device chips 9 connected to the redistribution layer, and a mold resin layer 11 for sealing each device chip 9. The workpiece 7 has substantially the same size and shape as those of the carrier plate 3 as viewed in plan. For example, the workpiece 7 has a thickness of 1.5 mm or less, typically, 0.6 mm.

The workpiece 7 has a first surface (front side) 7a. The first surface 7a of the workpiece 7 may be processed by grinding or the like. The plural device chips 9 in the workpiece 7 are arranged at given intervals, and a division line (cut line) is set in an area defined between any adjacent ones of the plural device chips 9. That is, a plurality of crossing division lines are set in the workpiece 7 in the area where the device chips 9 are not formed. By cutting the workpiece 7 along at least one arbitrary division line, the workpiece 7 is divided into a plurality of workpiece segments each including one or more device chips 9.

By cutting the workpiece 7 (or each workpiece segment) along all of the division lines, a plurality of package devices respectively corresponding to the plural device chips 9 can be obtained. However, the material, shape, structure, size, etc. of the workpiece 7 are not especially limited. For example, the workpiece 7 may be mainly composed of a redistribution layer without including the device chips 9 and the mold resin layer 11.

Figure 1B:
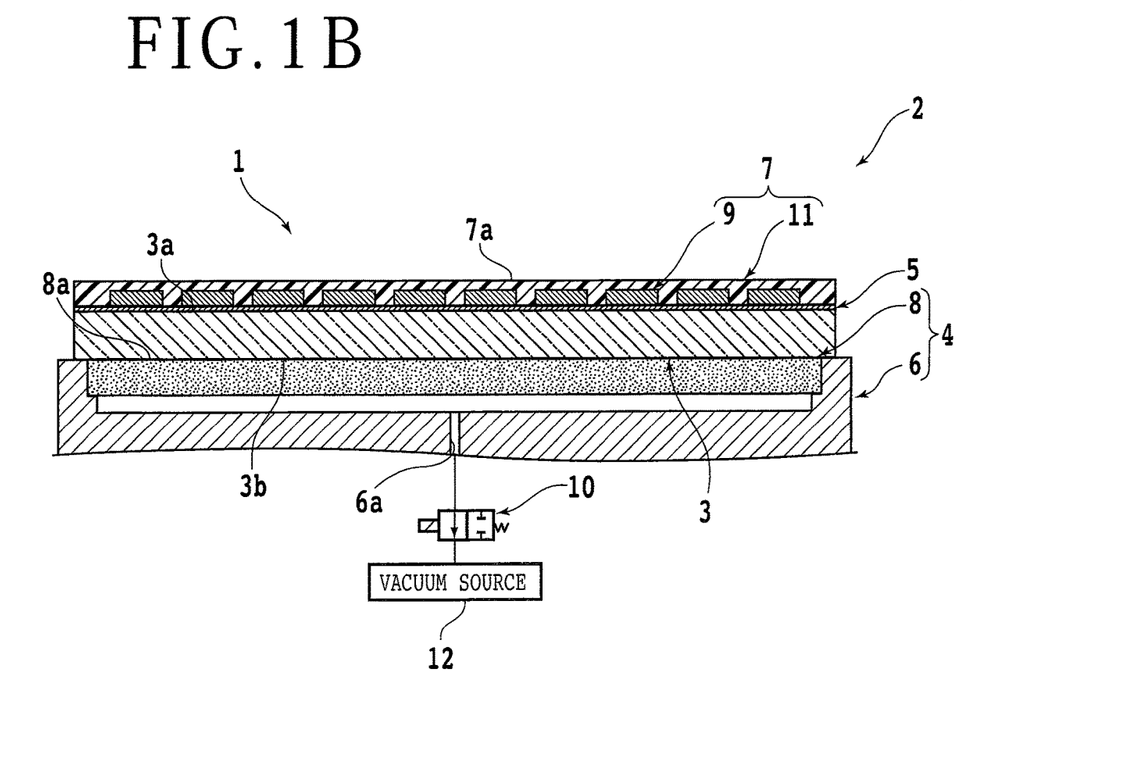
FIG. 1B is a sectional view depicting a condition that the carrier plate of the composite substrate is held on a chuck table in a shoulder portion forming step of a carrier plate removing method according to a preferred embodiment of the present invention.

In the carrier plate removing method according to this preferred embodiment, the shoulder portion forming step is first performed to form a shoulder portion in the peripheral portion of the carrier plate 3 constituting the composite substrate 1. More specifically, the carrier plate 3 of the composite substrate 1 is first held so that the workpiece 7 is exposed upward. FIG. 1B is a sectional view depicting a condition that the carrier plate 3 of the composite substrate 1 is held in the shoulder portion forming step. In FIG. 1B, a part of the components is depicted by a functional block.

The shoulder portion forming step is performed by using a cutting apparatus 2 depicted in FIG. 1B or the like. The cutting apparatus 2 includes a chuck table 4 for holding the composite substrate 1. The chuck table 4 includes a cylindrical frame 6 and a holding plate 8 provided at an upper portion of the frame 6. The frame 6 is formed of metal such as strainless steel, typically. The holding plate 8 is formed of a porous material.

The holding plate 8 has an upper surface as a holding surface 8a for holding the carrier plate 3 of the composite substrate 1 under suction. The holding plate 8 has a lower surface connected through a passage 6a and a valve 10 or the like to a vacuum source 12. The passage 6a is formed in the frame 6. Accordingly, when the valve 10 is opened, a vacuum produced from the vacuum source 12 can be applied to the holding surface 8a.

The chuck table 4 (the frame 6) is connected to a rotational drive source (not depicted) such as a motor, so that when the rotational drive source is operated, the chuck table 4 is rotated about a vertical axis substantially perpendicular to the holding surface 8a by a force produced by the rotational drive source. Further, the chuck table 4 (the frame 6) is supported by a feeding mechanism (not depicted), so that the chuck table 4 can be moved in a feeding direction substantially parallel to the holding surface 8a by operating the feeding mechanism.

In holding the carrier plate 3 of the composite substrate 1 to expose the workpiece 7 upward, the second surface 3b of the carrier plate 3 is brought into contact with the holding surface 8a of the chuck table 4 as depicted in FIG. 1B. Thereafter, the valve 10 is opened to apply a vacuum from the vacuum source 12 to the holding surface 8a. As a result, the carrier plate 3 of the composite substrate 1 is held on the chuck table 4 under suction, so that the workpiece 7 is exposed upward.

Figure 2A:
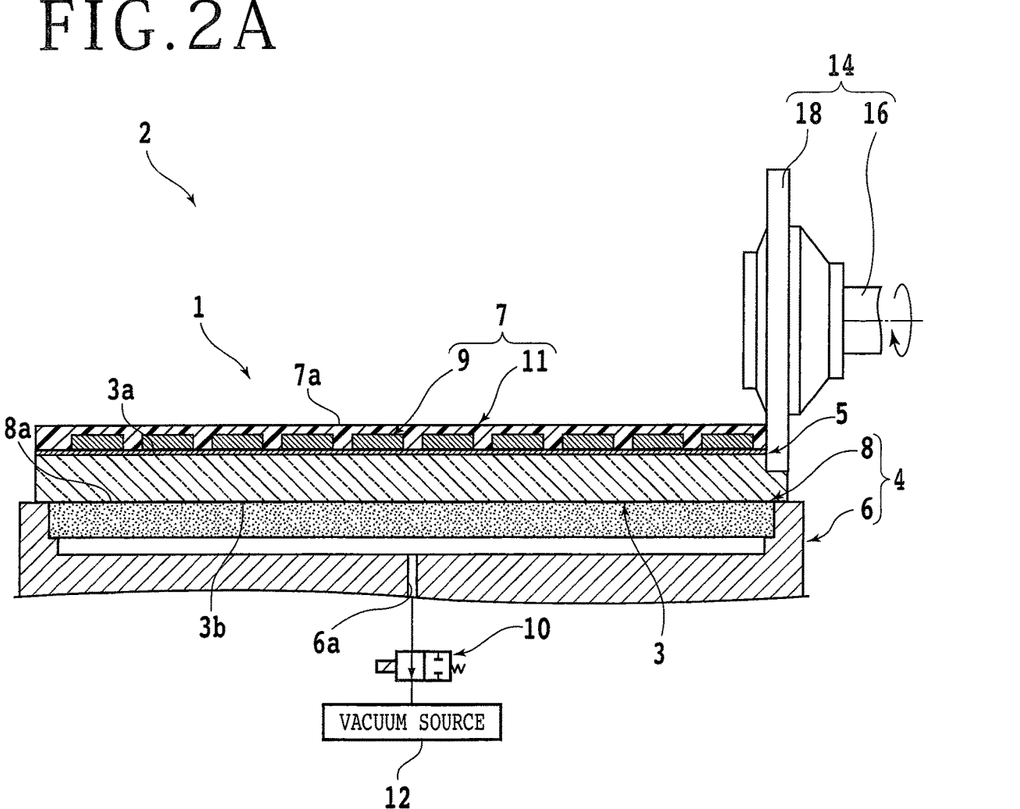
FIG. 2A is a sectional view depicting a condition that a shoulder portion is being formed on the carrier plate in the shoulder portion forming step.

After holding the carrier plate 3 of the composite substrate 1 to expose the workpiece 7 upward as mentioned above, a shoulder portion is formed along the peripheral edge of the carrier plate 3 in the following manner. FIG. 2A is a sectional view depicting a condition that a shoulder portion 3c (see FIG. 2B) is being formed on the carrier plate 3 by using the cutting apparatus 2 in the shoulder portion forming step. In FIG. 2A, a part of the components is depicted by a functional block.

As depicted in FIG. 2A, the cutting apparatus 2 includes a cutting unit 14 for forming the shoulder portion 3c. The cutting unit 14 is provided above the chuck table 4. The cutting unit 14 includes a spindle 16 having a horizontal axis substantially parallel to the holding surface 8a. An annular cutting blade 18 is mounted on the spindle 16 at one end thereof. The cutting blade 18 is formed by dispersing abrasive grains in a bond.

A rotational drive source (not depicted) such as a motor is connected to the other end of the spindle 16, so that when this rotational drive source is operated, the cutting blade 18 mounted on the spindle 16 at its one end is rotated by a force produced by the rotational drive source. The cutting unit 14 is supported by an elevating mechanism (not depicted) and an indexing mechanism (not depicted), so that the cutting unit 14 is movable both in a vertical direction substantially perpendicular to the holding surface 8a and in an indexing direction substantially perpendicular to the vertical direction and the feeding direction.

In forming the shoulder portion 3c on the carrier plate 3, the chuck table 4 holding the composite substrate 1 is rotated to make a part of the peripheral edge of the carrier plate 3 (i.e., a part corresponding to one of the four sides of the rectangle as viewed in plan) substantially parallel to the feeding direction. Thereafter, the chuck table 4 and the cutting unit 14 are relatively moved to position the cutting blade 18 directly above an extension of the above part of the peripheral edge of the carrier plate 3.

Thereafter, the cutting unit 14 is vertically moved to position the lower end of the cutting blade 18 to the level lower than the first surface 3a of the carrier plate 3 and higher than the second surface 3b of the carrier plate 3. Thereafter, the cutting blade 18 is rotated and at the same time the chuck table 4 is moved in the feeding direction. As a result, the carrier plate 3 is cut along the above part of the peripheral edge from the first surface 3a by the cutting blade 18 as depicted in FIG. 2A. That is, a part of the peripheral portion of the carrier plate 3 corresponding to the above part of the peripheral edge is cut by the cutting blade 18.

Figure 2B:
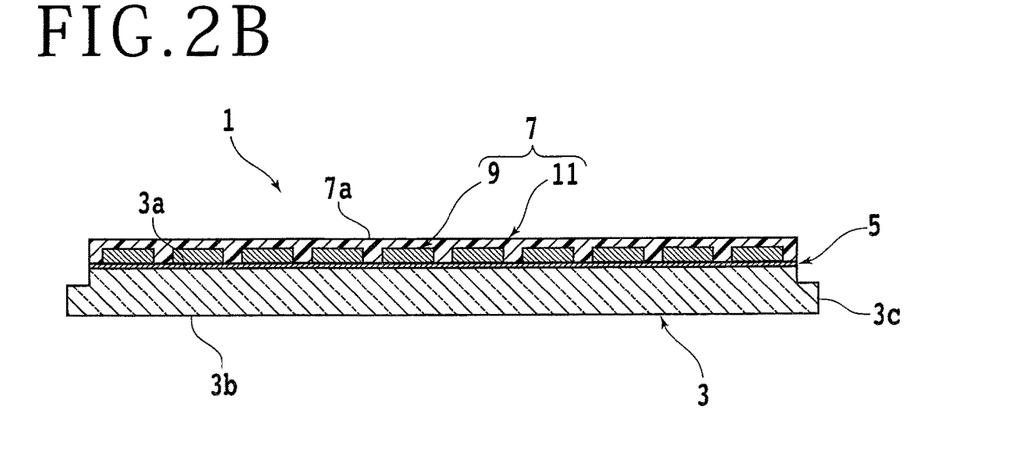
FIG. 2B is a sectional view depicting a condition that the shoulder portion has been formed in the whole of the peripheral portion of the carrier plate.

As described above, the lower end of the cutting blade 18 is set at the level not reaching the second surface 3b of the carrier plate 3. Accordingly, the shoulder portion 3c is formed in the above part of the peripheral portion of the carrier plate 3 in such a manner that a lower part connected to the second surface 3b projects sideward (i.e., projects horizontally outward in a direction parallel to the first surface 3a or the second surface 3b) as depicted in FIG. 2B.

The amount of overlap between the carrier plate 3 (peripheral portion) and the cutting blade 18 as viewed in plan (i.e., the width of the shoulder portion 3c to be formed, or the amount of projection of the shoulder portion 3c) is set in such a range that the package devices to be obtained by cutting the workpiece 7 are not influenced. For example, in the case that the width of a marginal area (peripheral marginal area) set in the peripheral portion of the workpiece 7 is large, the amount of overlap between the carrier plate 3 (the peripheral portion) and the cutting blade 18 (i.e., the width of the shoulder portion 3c) can be set large. For example, the width of the shoulder portion 3c is preferably set to a range of 0.2 mm to 5 mm in consideration of ease of removal of the carrier plate 3.

As described above, the temporary bonding layer 5 and the workpiece 7 have substantially the same size and shape as those of the carrier plate 3 as viewed in plan. Accordingly, when a part of the peripheral portion of the carrier plate 3 is cut by the cutting blade 18 from the first surface 3a, a peripheral area of the temporary bonding layer 5 and the workpiece 7 corresponding to the peripheral portion of the carrier plate 3 is also removed by the cutting blade 18 at the same time.

After forming the shoulder portion 3c in a part of the peripheral portion of the carrier plate 3 as mentioned above, a similar shoulder portion 3c is formed in the other part of the peripheral portion of the carrier plate 3 in a similar manner. When the shoulder portion 3c having a rectangular ring shape is formed in the whole of the peripheral portion of the carrier plate 3, the shoulder portion forming step is finished. FIG. 2B is a sectional view depicting the condition that the shoulder portion 3c has been formed in the whole of the peripheral portion of the carrier plate 3.

While the shoulder portion 3c is formed in the whole of the peripheral portion of the carrier plate 3 as depicted in FIG. 2B in this preferred embodiment, the shoulder portion 3c may be formed in at least an arbitrary part of the peripheral portion of the carrier plate 3. Further, in the case that the carrier plate 3 and the workpiece 7 are circular as viewed in plan (i.e., disk-shaped), the chuck table 4 may be rotated in the condition where the cutting blade 18 is lowered to cut the peripheral portion of the carrier plate 3, so that an annular shoulder portion can be formed on the carrier plate 3 along the peripheral edge thereof.

Figure 3A:
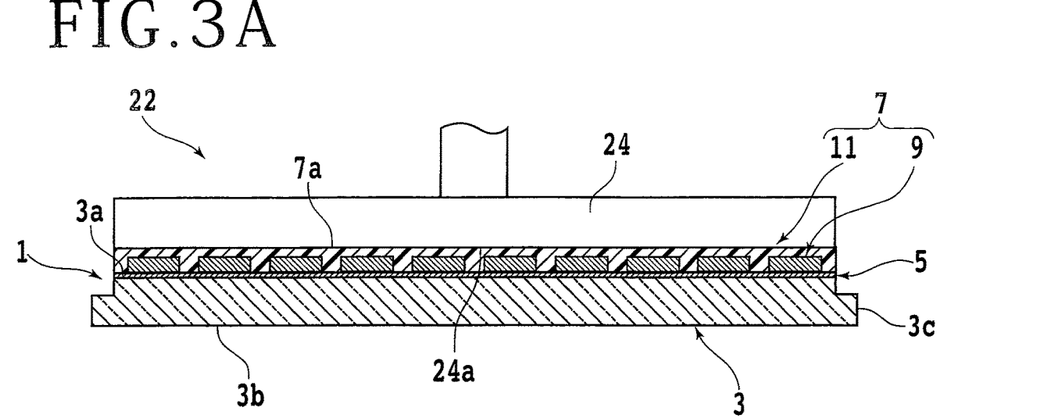
FIG. 3A is a sectional view depicting a holding step of the carrier plate removing method according to this preferred embodiment.

After performing the shoulder portion forming step, the holding step is performed to hold the workpiece 7 of the composite substrate 1 from the upper side thereof. FIG. 3A is a sectional view depicting the holding step. The holding step is performed by using a peeling apparatus 22 depicted in FIG. 3A. The peeling apparatus 22 includes a holding unit 24 for holding the workpiece 7 of the composite substrate 1 from the upper side thereof.

The holding unit 24 has a lower surface as a holding surface 24a for holding the workpiece 7 under suction. The holding surface 24a has substantially the same size as that of the first surface 7a of the workpiece 7. The holding surface 24a is connected through a passage (not depicted) and a valve (not depicted) to a vacuum source (not depicted). Accordingly, when this valve is opened, a vacuum produced from the vacuum source is applied to the holding surface 24a of the holding unit 24. The holding unit 24 is supported by an elevating mechanism (not depicted), so that the holding unit 24 is vertically movable.

In the holding step, the holding surface 24a of the holding unit 24 is first brought into contact with the first surface 7a of the workpiece 7 in the condition where the workpiece 7 is positioned above the carrier plate 3. Thereafter, the valve is opened to apply a vacuum from the vacuum source to the holding surface 24a. Accordingly, the workpiece 7 of the composite substrate 1 is held by the holding unit 24 from the upper side of the workpiece 7.

While the first surface 7a of the workpiece 7 comes into direct contact with the holding surface 24a of the holding unit 24 in this preferred embodiment, a porous sheet or the like may be interposed between the first surface 7a of the workpiece 7 and the holding surface 24a of the holding unit 24 in the holding step. In this case, it is possible to prevent damage or contamination or the like of the workpiece 7 due to the contact with the holding surface 24a.

Figure 3B:
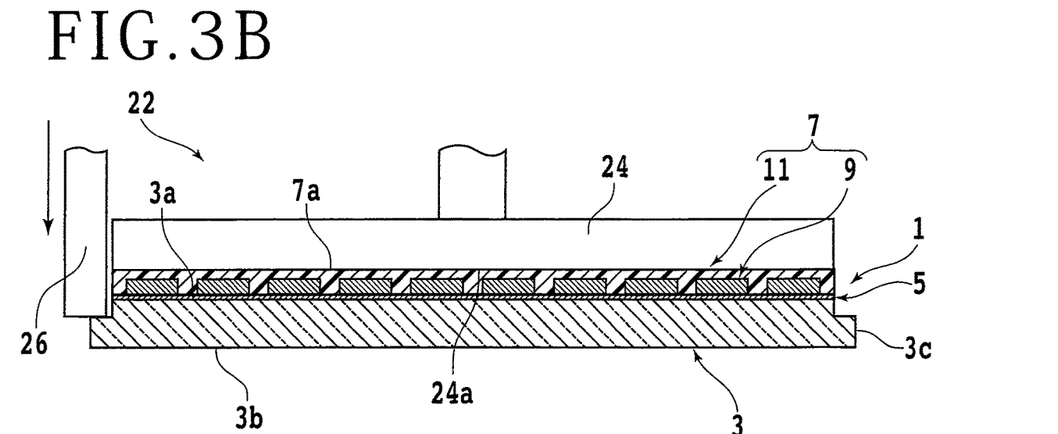
FIG. 3B is a sectional view depicting a carrier plate removing step of the carrier plate removing method according to this preferred embodiment.
Figure 3C:
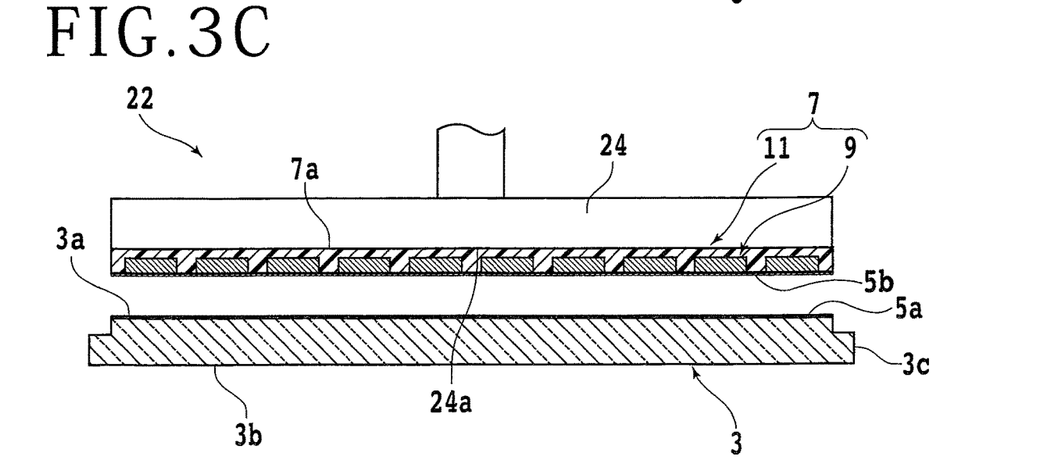
FIG. 3C is a sectional view depicting a condition that the carrier plate has been removed from the workpiece.

After performing the holding step, the carrier plate removing step is performed to remove the carrier plate 3 from the workpiece 7. FIG. 3B is a sectional view depicting the carrier plate removing step, and FIG. 3C is a sectional view depicting a condition that the carrier plate 3 has been removed from the workpiece 7. The carrier plate removing step is performed by using the peeling apparatus 22 used in the holding step.

As depicted in FIG. 3B, a rod-shaped push member 26 is provided adjacent to the holding unit 24 at a position corresponding to the shoulder portion 3c of the composite substrate 1 held by the holding unit 24. The push member 26 is supported by an elevating mechanism (not depicted) independent of the elevating mechanism for vertically moving the holding unit 24. Accordingly, the push member 26 is vertically movable independently of the holding unit 24.

In the carrier plate removing step, both the holding unit 24 and the push member 26 are first moved upward to raise the composite substrate 1 held by the holding unit 24. In other words, the second surface 3b of the carrier plate 3 is exposed downward. Thereafter, the push member 26 is moved downward in the condition where the position of the holding unit 24 is maintained, thereby bringing the lower end of the push member 26 into contact with the shoulder portion 3c. That is, the push member 26 applies a downward force to the shoulder portion 3c of the carrier plate 3.

As mentioned above, the workpiece 7 of the composite substrate 1 is held by the holding unit 24 from the upper side of the workpiece 7. Accordingly, when the push member 26 applies a downward force to the shoulder portion 3c of the carrier plate 3, the carrier plate 3 is peeled from the workpiece 7 in such a manner that the temporary bonding layer 5 is separated into the first part 5a and the second part 5b as depicted in FIG. 3C. As a result, the carrier plate 3 falls due to its own weight. In other words, the carrier plate 3 is moved away from the workpiece 7. Thus, the whole of the carrier plate 3 is separated from the workpiece 7, that is, the carrier plate 3 is removed from the workpiece 7, and the carrier plate removing step is finished.

As described above, the carrier plate removing method includes the shoulder portion forming step of cutting the peripheral portion of the carrier plate 3 along the peripheral edge thereof from the first surface 3a of the carrier plate 3 on which the workpiece 7 is provided, thereby forming the shoulder portion 3c as a lower part connected to the second surface 3b of the carrier plate 3, the lower part projecting horizontally outward from the side surface of an upper part connected to the first surface 3a of the carrier plate 3.

Accordingly, by applying a downward force to the shoulder portion 3c in the condition where the workpiece 7 is held by the holding unit 24 from the upper side of the workpiece 7, the carrier plate 3 can be easily removed from the workpiece 7. Further, since gravity acts on the carrier plate 3 in addition to the downward force applied to the shoulder portion 3c, the carrier plate 3 can be removed from the workpiece 7 even when the downward force to be applied to the shoulder portion 3c is small.

The present invention is not limited to the above preferred embodiment, but various modifications may be made. For example, while the push member 26 is vertically movable independently of the holding unit 24 in this preferred embodiment, the push member 26 may be relatively movable with respect to the holding unit 24.

For example, the push member 26 may be fixed to a housing (not depicted) of the peeling apparatus 22, and only the holding unit 24 may be vertically moved. Accordingly, when the holding unit 24 is moved upward, the push member 26 can be relatively moved downward with respect to the holding unit 24. Further, while the single push member 26 is used in this preferred embodiment, a plurality of push members 26 may be used.

Further, while the shoulder portion 3c is formed by using the cutting blade 18 to cut the peripheral portion of the carrier plate 3 along the peripheral edge thereof from the first surface 3a in this preferred embodiment, the shoulder portion 3c may be formed by applying a laser beam along the peripheral edge of the carrier plate 3 from the first surface 3a. In this case, the cutting apparatus 2 (the cutting unit 14) is replaced by a laser processing apparatus (laser processing unit) capable of applying a laser beam having an absorption wavelength to at least the carrier plate 3.

Figure 4A:
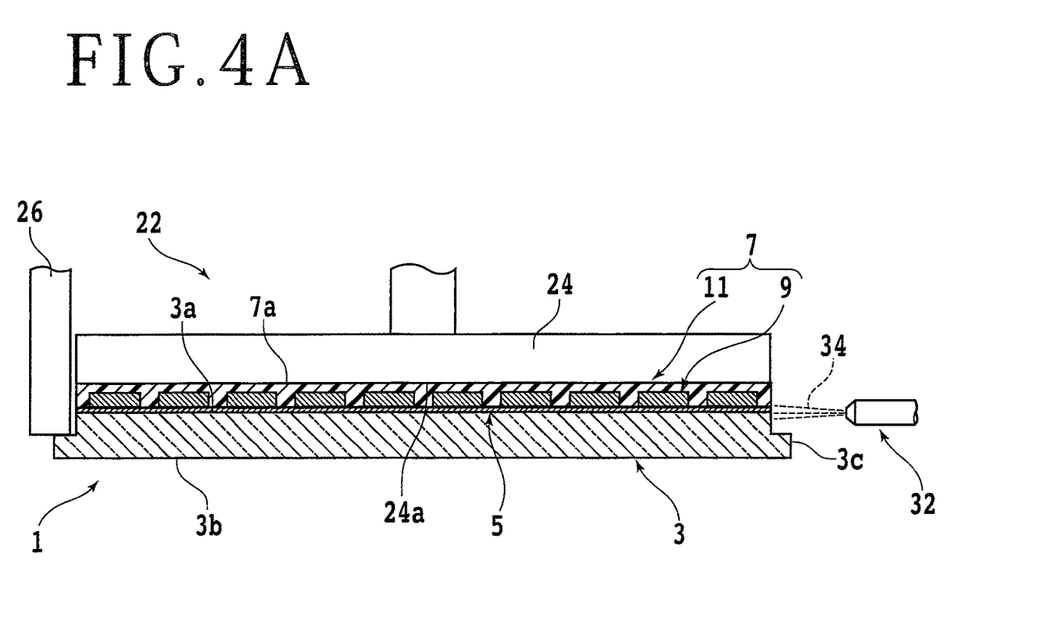
FIG. 4A is a sectional view depicting a first modification of the carrier plate removing step.

Further, in removing the carrier plate 3 in the carrier plate removing step, a fluid may be sprayed to the boundary between the carrier plate 3 and the workpiece 7 (i.e., an area corresponding to the temporary bonding layer 5). FIG. 4A is a sectional view depicting a carrier plate removing step according to a first modification. As depicted in FIG. 4A, a nozzle 32 is provided near the side surface of the holding unit 24 of the peeling apparatus 22 to be used in the first modification. The nozzle 32 is connected through a passage (not depicted) and a valve (not depicted) to a fluid source (not depicted) for supplying a fluid 34. Accordingly, the fluid 34 is adapted to be sprayed from the nozzle 32.

After spraying the fluid 34 from the nozzle 32 to the boundary between the carrier plate 3 and the workpiece 7 held by the holding unit 24 or as spraying the fluid 34 from the nozzle 32 to the boundary between the carrier plate 3 and the workpiece 7 held by the holding unit 24, a downward force is applied from the push member 26 to the shoulder portion 3c, so that the carrier plate 3 can be peeled from the workpiece 7 more easily. As the fluid 34 to be sprayed to the boundary between the carrier plate 3 and the workpiece 7, air or water may be used, for example. However, the kind of the fluid 34 is not especially limited.

Figure 4B:
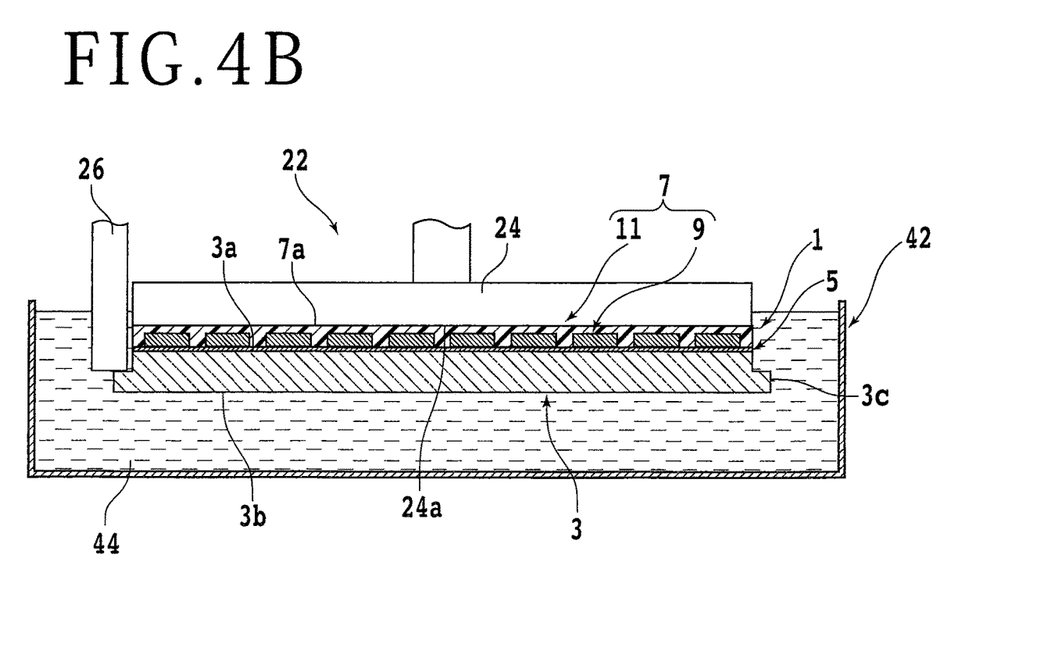
FIG. 4B is a sectional view depicting a second modification of the carrier plate removing step.

Further, in removing the carrier plate 3 in the carrier plate removing step, the carrier plate 3 and the workpiece 7 may be immersed in a liquid. FIG. 4B is a sectional view depicting a carrier plate removing step according to a second modification. As depicted in FIG. 4B, a bath 42 having a size capable of accommodating the carrier plate 3 and the workpiece 7 is provided below the holding unit 24 of the peeling apparatus 22 to be used in the second modification. A liquid 44 such as water is stored in the bath 42.

The carrier plate 3 and the workpiece 7 held by the holding unit 24 are immersed into the liquid 44 stored in the bath 42. Thereafter, a downward force is applied from the push member 26 to the shoulder portion 3c to thereby peel the carrier plate 3 from the workpiece 7, so that the carrier plate 3 falls due to its own weight in the liquid 44. Since the carrier plate 3 falls in the liquid 44, a shock to the carrier plate 3 due to falling can be reduced as compared with the case that the carrier plate 3 falls in the air. As a result, damage to the carrier plate 3 and vibration of the peeling apparatus 22 or the like can be prevented.

In the second modification, a surface active agent may be contained in the liquid 44. As the surface active agent to be contained in the liquid 44, an anionic surface active agent or cationic surface active agent or the like which can easily penetrate into the temporary bonding layer 5 may be used. By using the liquid 44 containing such a surface active agent which can easily penetrate into the temporary bonding layer 5, the temporary bonding layer 5 can be easily separated at an area where the surface active agent has penetrated. As a result, the carrier plate 3 can be peeled from the workpiece 7 more easily.

In the second modification, vibration such as ultrasonic vibration may be applied to the push member 26 in applying a downward force from the push member 26 to the shoulder portion 3c in the condition where the carrier plate 3 and the workpiece 7 are immersed in the liquid 44. More specifically, a downward force is applied from the push member 26 to the shoulder portion 3c as applying vibration such as ultrasonic vibration to the push member 26. In this case, the vibration is transmitted from the push member 26 to the carrier plate 3, so that the carrier plate 3 can be peeled from the workpiece 7 more easily.

Similarly, vibration such as ultrasonic vibration may be applied to the liquid 44 in applying a downward force from the push member 26 to the shoulder portion 3c in the condition where the carrier plate 3 and the workpiece 7 are immersed in the liquid 44. More specifically, a downward force is applied from the push member 26 to the shoulder portion 3c as applying vibration such as ultrasonic vibration to the liquid 44. In this case, the vibration is transmitted from the liquid 44 to the carrier plate 3, so that the carrier plate 3 can be peeled from the workpiece 7 more easily.

Further, the first modification may be combined with the second modification. In this case, the carrier plate 3 and the workpiece 7 are first immersed into the liquid 44. Thereafter, the fluid 34 is sprayed from the nozzle 32 to the boundary between the carrier plate 3 and the workpiece 7 (i.e., an area corresponding to the temporary bonding layer 5). Further, a downward force is applied from the push member 26 to the shoulder portion 3c after spraying the fluid 34 to the boundary between the carrier plate 3 and the workpiece 7 or as spraying the fluid 34 to the boundary between the carrier plate 3 and the workpiece 7. As a result, the carrier plate 3 can be peeled from the workpiece 7 more easily.

In addition, the structure and method in the above preferred embodiment may be suitably changed without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A carrier plate removing method for removing a carrier plate from a workpiece, said carrier plate having a front side and a back side opposite to said front side, said workpiece being previously provided through a temporary bonding layer on the front side of said carrier plate, said carrier plate removing method comprising:
    forming a shoulder portion as a lower part connected to the back side of said carrier plate, said lower part projecting horizontally outward from a side surface of an upper part connected to the front side of said carrier plate;
    a holding step of holding said workpiece by using a holding unit from an upper side of said workpiece in the condition where said workpiece is positioned above said carrier plate, after performing said shoulder portion forming step; and
    a carrier plate removing step of applying a downward force from a push member to said shoulder portion after performing said holding step, thereby moving said carrier plate away from said workpiece to thereby remove said carrier plate from said workpiece.

2. The carrier plate removing method according to claim 1, wherein
    said carrier plate removing step includes a step of spraying a fluid to a boundary between said carrier plate and said workpiece, said downward force being applied from said push member to said shoulder portion after spraying said fluid or as spraying said fluid, thereby removing said carrier plate from said workpiece.

3. The carrier plate removing method according to claim 2, wherein
    said carrier plate removing step includes the step of immersing said workpiece and said carrier plate in a liquid, said downward force being applied from said push member to said shoulder portion in the condition where said workpiece and said carrier plate are immersed in said liquid.

4. The carrier plate removing method according to claim 3, wherein said liquid contains a surface active agent.

5. The carrier plate removing method according to claim 4, wherein
    said carrier plate removing step includes a step of applying vibration to said push member in the condition where said workpiece and said carrier plate are immersed in said liquid, said downward force being applied from said push member to said shoulder portion while applying said vibration to said push member.

6. The carrier plate removing method according to claim 4, wherein said carrier plate removing step includes a step of applying vibration to said liquid in the condition where said workpiece and said carrier plate are immersed in said liquid, said downward force being applied from said push member to said shoulder portion while applying said vibration to said liquid.

7. The carrier plate removing method according to claim 3, wherein
said carrier plate removing step includes a step of applying vibration to said push member in the condition where said workpiece and said carrier plate are immersed in said liquid, said downward force being applied from said push member to said shoulder portion while applying said vibration to said push member.

8. The carrier plate removing method according to claim 3, wherein
said carrier plate removing step includes a step of applying vibration to said liquid in the condition where said workpiece and said carrier plate are immersed in said liquid, said downward force being applied from said push member to said shoulder portion while applying said vibration to said liquid.

9. The carrier plate removing method according to claim 1, wherein
said carrier plate removing step includes a step of immersing said workpiece and said carrier plate in a liquid, said downward force being applied from said push member to said shoulder portion in the condition where said workpiece and said carrier plate are immersed in said liquid.

10. The carrier plate removing method according to claim 9, wherein said liquid contains a surface active agent.

11. The carrier plate removing method according to claim 10, wherein
said carrier plate removing step includes a step of applying vibration to said push member in the condition where said workpiece and said carrier plate are immersed in said liquid, said downward force being applied from said push member to said shoulder portion while applying said vibration to said push member.

12. The carrier plate removing method according to claim 10, wherein
said carrier plate removing step includes a step of applying vibration to said liquid in the condition where said workpiece and said carrier plate are immersed in said liquid, said downward force being applied from said push member to said shoulder portion while applying said vibration to said liquid.

13. The carrier plate removing method according to claim 9, wherein
said carrier plate removing step includes a step of applying vibration to said push member in the condition where said workpiece and said carrier plate are immersed in said liquid, said downward force being applied from said push member to said shoulder portion while applying said vibration to said push member.

14. The carrier plate removing method according to claim 9, wherein
said carrier plate removing step includes a step of applying vibration to said liquid in the condition where said workpiece and said carrier plate are immersed in said liquid, said downward force being applied from said push member to said shoulder portion while applying said vibration to said liquid.

15. The carrier plate removing method according to claim 1, wherein the forming a shoulder portion is performed using a cutting blade to remove a peripheral portion of said carrier plate along a peripheral edge thereof.

16. The carrier plate removing method according to claim 15 wherein the cutting blade removes a peripheral portion of said carrier plate from the front side of said carrier plate and removes a peripheral portion of the workpiece at the same time.

17. The carrier plate removing method according to claim 1, wherein the forming a shoulder portion is performed using a laser beam to remove a peripheral portion of said carrier plate along a peripheral edge thereof.

* * * * *